United States Patent
Hosoya et al.

(10) Patent No.: US 6,792,366 B2
(45) Date of Patent: Sep. 14, 2004

(54) METHOD AND APPARATUS FOR INSPECTING DEFECTS IN A SEMICONDUCTOR WAFER

(75) Inventors: Naoki Hosoya, Tokyo (JP); Yuuji Takagi, Tokyo (JP); Hisae Shibuya, Tokyo (JP); Kenji Obara, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 217 days.

(21) Appl. No.: 10/015,276

(22) Filed: Dec. 11, 2001

(65) Prior Publication Data
US 2003/0109070 A1 Jun. 12, 2003

(51) Int. Cl.[7] .......................... H01L 21/00; G06F 19/00
(52) U.S. Cl. ........................................ 702/83; 438/14
(58) Field of Search ................. 702/81–84; 438/14–18; 700/108–110, 121; 382/145, 149; 324/765

(56) References Cited

U.S. PATENT DOCUMENTS

| | | | | |
|---|---|---|---|---|
| 5,539,752 A | * | 7/1996 | Berezin et al. | 714/724 |
| 5,544,256 A | * | 8/1996 | Brecher et al. | 382/149 |
| 5,982,920 A | * | 11/1999 | Tobin et al. | 382/145 |
| 5,985,680 A | * | 11/1999 | Singhal et al. | 438/7 |
| 5,991,699 A | * | 11/1999 | Kulkarni et al. | 702/83 |
| 6,446,021 B1 | * | 9/2002 | Schaeffer | 702/118 |
| 6,613,590 B2 | * | 9/2003 | Simmons | 438/14 |
| 6,635,872 B2 | * | 10/2003 | Davidson | 250/307 |
| 2002/0052053 A1 | * | 5/2002 | Ono et al. | 438/12 |
| 2002/0145112 A1 | * | 10/2002 | Davidson | 250/307 |
| 2004/0054432 A1 | * | 3/2004 | Simmons | 700/110 |

* cited by examiner

*Primary Examiner*—Evan Pert
(74) *Attorney, Agent, or Firm*—Townsend and Townsend and Crew LLP

(57) ABSTRACT

In a wafer inspection and sampling system, wafer defects are detected and stored in a data store as defect data. Information is also provided, representative of clusters of defects on the wafer. A statistically based sampling of the defects is made to obtain a set of sampled defects. Subsequent detailed inspection and analysis of the sampled defects produces additional data which facilitate an understanding of process errors.

10 Claims, 10 Drawing Sheets

FIG.2

| Reliability | U |
|---|---|
| 0.80 | 1.28 |
| 0.90 | 1.65 |
| 0.98 | 2.33 |
| ... | ... |

| n \ P | 0.1 | 0.2 | 0.3 | 0.4 | 0.5 | 0.6 | 0.7 | 0.8 | 0.9 |
|---|---|---|---|---|---|---|---|---|---|
| 0.05 | 59 | 105 | 138 | 158 | 164 | 158 | 138 | 105 | 59 |
| e 0.10 | 15 | 26 | 35 | 39 | 41 | 39 | 35 | 26 | 15 |
| 0.20 | 4 | 7 | 9 | 10 | 10 | 10 | 9 | 7 | 4 |
| ... | ... | ... | ... | ... | ... | ... | ... | ... | ... |

METHOD AND APPARATUS FOR INSPECTING DEFECTS IN A SEMICONDUCTOR WAFER

CROSS-REFERENCES TO RELATED APPLICATIONS

NOT APPLICABLE

BACKGROUND OF THE INVENTION

The present invention relates generally to semiconductor manufacturing, and more specifically to inspection of semiconductor wafers for defects.

In the manufacturing of semiconductor wafers, inspection of the wafer is executed after each manufacturing process, the idea being to improve yields by detecting process changes that might negatively affect yield. Process variations manifest themselves as defects in and on the wafer. An initial inspection of each wafer is made to detect that there are defects at all. A variety of inspection tools are available for making such inspections. The kinds of defects that can be detected by these inspection techniques include, for example, pattern short-circuits, pattern disconnections, foreign materials, depressions, scratches, separation of conductor, unevenness, etc. The initial inspection can only identify that defects exist, the number of defects, their locations on the wafer, etc., but generally cannot identify the kinds of defects. Consequently, the defects are subjected to a detailed review subsequent to the initial inspection using technologies including conventional optical microscopes, scanning electron microscopes (SEMs), and the like in order to determine the specific kinds of defects (e.g., shorts, disconnections, and so on). This additional detailed information facilitates an understanding of the causes of the defects, to detect that the process is changing, how the process is changing, and how to adjust the processes accordingly to avoid such defects.

Ideally, a detailed inspection of all defects detected on all semiconductor wafers coming off the production line is made in order to provide as complete an understanding as possible of the manufacturing process. However, such a brute force approach is not feasible or practical due to the large numbers of wafers that are produced and the large numbers of defects per wafer that can occur. Consequently, in practice, the review task is limited to a small population of defects selected from among all of the detected defects. The smaller population of defects are then subjected to further detailed review to gain an understanding of the manufacturing process and to detect process variations, albeit a less accurate understanding.

A conventional technique for selecting defects for inspection is shown in FIG. 11. A semiconductor wafer 1101 is initially inspected to detect the existence of defects (including location of the defect on the wafer), which are indicated by the diamond shapes and identified generally by reference numeral 2. The defects (which can number in the thousands) are collected and stored as defect data 1112, for example in a database. An area of interest 1122 on the semiconductor wafer representation 1103 serves as a selection criterion for obtaining a small set of defects from among all of the defects. The area of interest is input by a user as a specified region 1114. A defect selection process 1116 makes a selection of defects from the defect data in accordance with the specified area of interest, selecting all of the defects within the user-specified area. The selected defect data 1118 are then produced as an output to the user in a suitable format. As can be seen in the figure, semiconductor wafer 1101' illustrates the selected defects indicated by the filled diamond shapes and identified generally by reference numeral 3. The selected defects are then subjected to closer more detailed examination to determine the kind of defect, distribution patterns of the different kinds of defects, etc. to gain a further understanding of the condition of the manufacturing process.

Another conventional technique for selecting defects is shown in FIG. 12. A semiconductor wafer 1201 is initially inspected to detect the existence of defects 2. The defects are collected as defect data 1212. The defects for further detailed study are selected purely at random. The number of defects selected is based on a selection criterion known as a selection ratio 1214 which is input to a selection process 1216. The selection ratio is simply a percentage value of the total defects; for example a selection ratio of 0.3 would refer to 30% of the total detected defects. The defects are randomly selected until the ratio of the number of selected defects to the total number of detected defects is equal to the selection ratio; this constitutes the selected defect data 1218. The selected defects are then presented to the user in a suitable format. FIG. 12 shows a typical random pattern of selected defects 3' on semiconductor wafer 1201'. A subsequent detailed examination of the selected defects is then made to identify process variations as discussed above in connection with FIG. 11.

A selection criterion based on a particular region of the semiconductor (such as in FIG. 11) is likely to be inadequate for process variations in which the process error is location-specific. Wafer defects will tend to have a non-uniform distribution pattern. A selection of defects based on a user-specified region of the semiconductor wafer can result in a low number of selected defects if the defects are clustered in a region of the semiconductor wafer other than the region specified by the user. Consequently, the subsequent detailed inspection of the sampled defects will not provide an accurate indication of the process error.

A selection criterion based purely on a random sampling of the entire wafer as explained in connection with FIG. 12 can mask out the effect of process errors which result in location-specific defects. When defects for further detailed study are selected purely at random, the non-uniformity of distribution of the defects is not reflected in the selected defects. Consequently, it is difficult to ascertain certain information such as the distribution of the different kinds of defects on the wafer.

Some process errors result in a distribution of defects on the semiconductor wafer where the defects are grouped in clusters having varying densities of defects; for example, some defects may be located in a region of densely distributed defects (hereinafter referred to as the "densely distributed region") and other defects may be located in a region of sparsely distributed defects (hereinafter referred to as the "sparsely distributed region") have different causes and different classified-by-kind defect percentages. In such cases, the selection of defects for further detailed inspection may be conducted separately for clusters of defects of different densities. In the method of selecting a particular cluster, an operation of dividing the defects into those of the densely distributed region(s) and those of the sparsely distributed region requires the decision making of an operator. Due to the subjective nature of this approach, it is likely that the defined clusters will vary from operator to operator. On the other hand, if the selection is made randomly, the majority of the selected defects will tend to be those defects located in the more densely distributed region(s). The defects in the sparsely distributed region are not likely to be adequately sampled. Therefore, it is difficult to gain an understanding of process errors when defects are clustered in this way.

There is a need to provide an inspection semiconductor wafers which improve on shortcomings of conventional semiconductor wafer inspection methods and systems.

SUMMARY OF THE INVENTION

A semiconductor wafer inspection and review method and system comprise detecting defects in a semiconductor wafer and storing information relating to the detected defects in an appropriate data store. Along with the detected defects, additional information relating to clusters of defects on the semiconductor wafer is produced and stored. The defects are sampled based on statistical criteria to produce sampled defects. Subsequent detailed inspection and analysis of the sampled defects produce information relating to the subsequent review of the sampled data. A suitable user interface is provided allowing the user to exchange information relating to the sampling of the defects. A suitable user interface is also provided to allow the user to interact with the information relating to the subsequent review of the sampled data.

BRIEF DESCRIPTION OF THE DRAWINGS

FIGS. 2 and 3 illustrate a table-driven variation of the processing shown in the embodiment illustrated in FIG. 1;

DESCRIPTION OF THE SPECIFIC EMBODIMENTS

In accordance with embodiments of the invention, semiconductor wafer defects are sampled based on statistical techniques to produce a sampling of the defects, which are then subject to subsequent detailed review. In an illustrative embodiment of the invention, statistical criteria such as a reliability and allowable error are used as the basis for sampling. However, it will be readily apparent from the following discussion that any of a number of known statistical techniques are appropriate for sampling defects.

Figure 1:
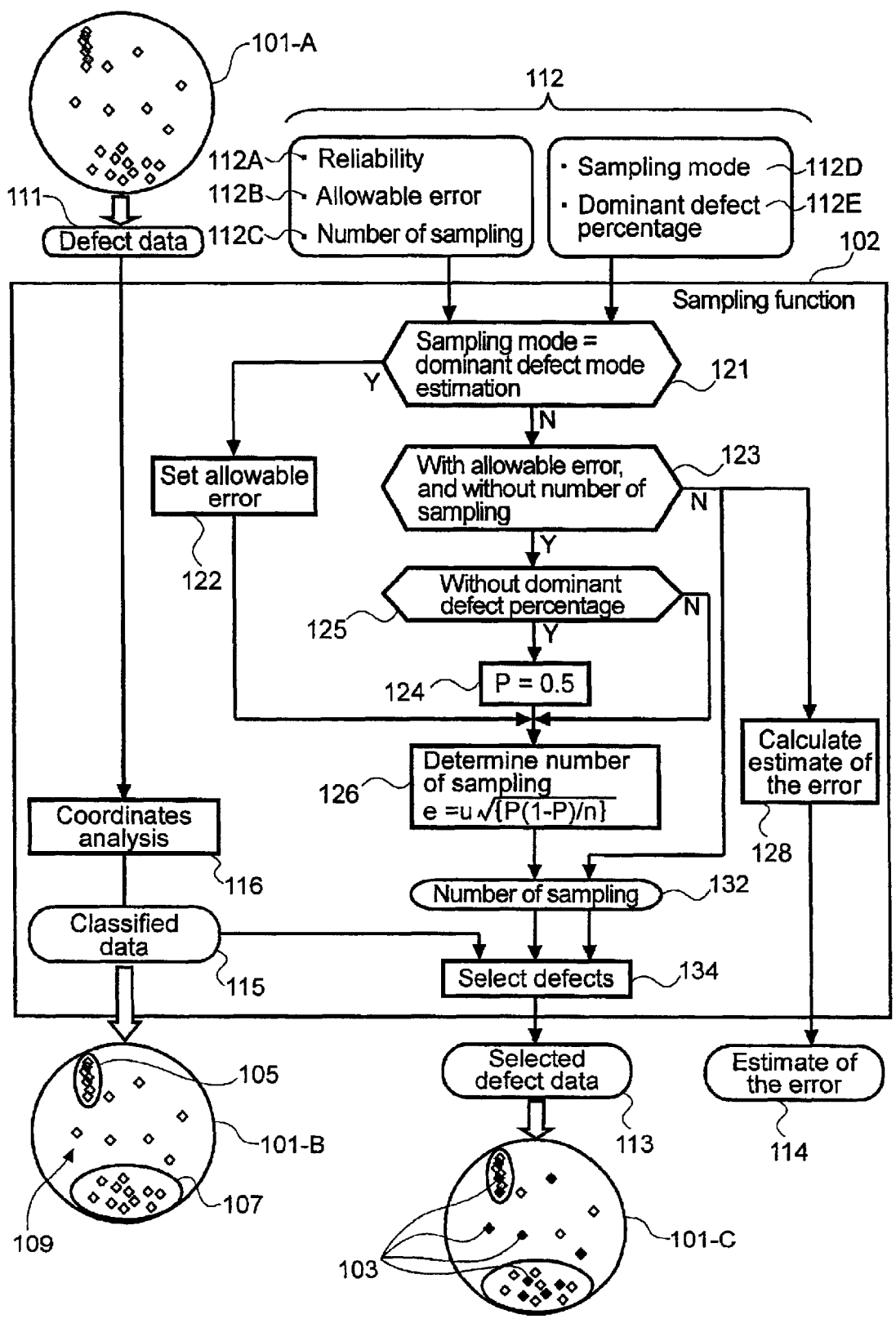
FIG. 1 is a high level schematic illustration of an illustrative embodiment of the present invention.

FIG. 1 shows an illustrative example of how such factors are processed to take a sample of semiconductor wafer defects. In a wafer processing facility, a wafer 101 (position A) is sampled from a production lot and subjected to defect detection. Wafer defects are identified using conventionally known inspection tools and methods; for example, detecting pattern mismatches between actual patterns on the wafer and expected patterns; detection of the presence of foreign particles by light refraction techniques; and so on. The location of the defects are noted which comprise defect data 111. A sampling function unit 102 receives the defect data 111 collected on the wafer 101. It is conventionally understood that inspection tools typically do not identify every defect that exists on the wafer, and that occasional false positive detections of defects will occur.

The defect data 111 is subjected to coordinate analysis processing 116 to find the local densities of defects (clusters of defects) on the wafer 101. A plurality of clusters of defects are defined and classified in terms of the degree of density of each cluster. For example, in the illustrated embodiment, each defect is classified as belonging to a sparsely distributed cluster, a densely distributed cluster, and a very densely distributed cluster. Of course, additional clusters can be defined. FIG. 1 shows, in wafer 101 (at position B), that the defects are classified into a highly dense cluster 105, a dense cluster 107, and a sparse cluster 109.

Many conventional techniques are available for coordinate analysis processing 116 to classify the defects into clusters of defects. In the illustrated embodiment, the coordinate analysis processing is based on geometrical lexical pattern analysis. An image of the distribution of defects on the wafer 101 is processed with the geometrical lexical patterns. The clusters are then classified to one of the automatically compiled plural geometrical lexical patterns. The resulting classified defects data 115 includes defect locations and clustering information indicative of the cluster to which each defect belongs. The classified data 115 feed into a sampled data selection process 134.

Continuing with the sampling function unit 102, user input 112 is provided to the sampling function unit 102. User input includes a reliability value 112A, an allowable error value 112B, a number of samples specifier 112C, a sampling mode specifier 112D, and a dominant defect percentage value 112E. In a first mode of operation, the sampling function unit produces a sample of defects taken from the classified data 115, the sampled defects. In the first mode of operation, the sampling function unit 102, accepts a reliability value 112A and an allowable error value 112B from the user, and produces a number of samples to be taken from the classified data 115 (i.e., number of sampled defects) and the locations of the sampled defects.

The sampled defects will have a certain distribution of classified-by-kind defect percentages. That is, the sampled defects will comprise x % of defect kind A, y % of defect kind B, z % of defect kind C, and so on. These percentages will differ from the distribution of classified-by-kind percentages of the actual defects present on the wafer 101. The allowable error value indicates a tolerance that reflects a range of error between the distribution of classified-by-kind defect percentages in the sampled defects and the classified-by-kind defect percentages of the actual defects on the wafer. In an embodiment of the invention, the allowable error value is a percentage value. Thus, for example, a 5% allowable error value indicates the following: the percentage of defects of kind A in the sampled defects is x±5%, the percentage of defects of kind B in the sampled defects is y±5%, the percentage of defects of kind C in the sampled defects is z±5%, and so on. The reliability value indicates the likelihood that the actual error lies within the range represented by the allowable error value.

In a second mode of operation, the sampling function unit 102 accepts a number of samples specifier 112C. In this mode of operation, the allowable error value is estimated. The number of samples of the sampled data is determined by the number of samples specifier.

The sampling mode specifier 112D specifies whether the number of samples in the sampled data is based on the allowable error value 112B (sampling mode is "%-estimation") or based on the dominant defect percentage value 112E (sampling mode is "DD %-estimation"). The dominant defect percentage value represents the percentage value of the defect having the highest classified-by-kind percentage. Thus, sampled defects based on a dominant defect percentage value are intended to represent the defect having the specified value.

The user input 112 is supplied to the sampling function unit 102. In this particular embodiment, the reliability value 112A must be supplied and the sampling mode 112D must be selected. Also, either the allowable error value 112B or the number of samples specifier 112C must be supplied. If in decision step 121, it is determined that the sampling mode specifier 112D indicates "%-estimation," then processing proceeds to decision step 123. The decision step 123 determines if both the allowable error value 112B was specified and the number of sampling specifier 112C was not specified. If so, then processing proceeds to decision step 125. In step 125, if a dominant defect percentage value 112E is not specified, then it is set to a predetermined value, step 124. In this illustrative embodiment, that predetermined value is P=0.5, where P is the dominant defect percentage value.

In step 126, the number of samples which will constitute the sampled defects is determined based on Equation 1:

$$e = U\sqrt{\frac{P(1-P)}{n}} \quad \text{Equation 1}$$

where, e is the allowable error, n is the number of samples,

U is a parameter that is based on the reliability value 112A, and

P is the dominant defect percentage value 112E

U is a parameter whose value is uniquely determined depending on the reliability. In this particular illustrative embodiment, the value of U is determined from the following system of equations, it being recognized that other forms would be appropriate:

$$\int_o^u f(x)\,dx = \frac{r}{2} \quad \text{Equation 2}$$

where $$f(x) = \frac{1}{\sqrt{2\pi}} e^{-x^2/2} \quad \text{Equation 3}$$

e is the natural logarithm (not the allowable error shown in Equation 1)

r is the user-provided reliability value 112A.

The value of U may be, for example, determined using a table look-up approach with pre-computed values. FIG. 2, for example, shows a table 202 representing a correspondence between the reliability value 112A and U. With the value of U determined, the number of samples is easily determined from Equation 1.

More generally, FIG. 3 shows an embodiment of the invention where the information is table driven 302. Thus, a set of data tables 322, 324, 326 is provided for pre-determined increments of the value U. Each table comprises an array of rows and columns. The columns 332 represent pre-determined increments of the dominant defect percentage value 112E (P). The rows 334 represent pre-determined increments of the allowable error value 112B (e). The array entries 336 represent the number of samples (n).

In the table driven embodiment of FIGS. 2 and 3, the user-supplied reliability value 112A provides the value of U by a simple table look-up operation. The value of U is used to select the correct data table 322, 324, 326. The number of samples (n) can then be determined by a second table look-up operation using the dominant defect percentage value (P) and the allowable error value (e).

Of course, it is understood that the table-driven approach is appropriate if it is acceptable that only pre-determined value increments are available to the user. Further, depending on the memory requirements, the table-driven approach may or may not be appropriate. A pure calculation approach of using Equation 1 and a pure table-driven approach of FIGS. 2 and 3 represent a trade-off in performance and hardware costs. Specific implementations will depend on factors not relevant to the practice of the invention.

Returning to FIG. 1, step 126 produces a number of samples result 132. A set of sampled defects 113 is produced by randomly selecting a number of defects (step 134) from the classified data 115 equal to the number of defects result. The selected defects are illustrated in FIG. 1 as defects 103 shown in the wafer 101 (at position C) by the filled diamond shapes. The sampled defects are then subjected to detailed analysis to identify the specific type of defect; e.g. short, opens, voids, and so on.

Returning to decision step 123, if the allowable error value 112B is not specified by the user, but a number of samples specifier 112C was provided, then the negative branch of the decision step is taken. The number of samples specifier becomes the number of samples result 132. The sampled defects 113 are then selected by randomly selecting a number of defects from the classified data 115 equal to the number of samples result. In step 128, an estimate of allowable error 114 is determined from Equation 1. Alternatively, the tables of FIGS. 2 and 3 can be used in a table-driven embodiment to produce the estimate of allowable error 114.

The classified-by-kind defect percentages for defects in the densely distributed cluster are different from those in the sparsely distributed cluster. Similarly, the dominant defect percentage in the densely distributed cluster is generally higher than in the sparsely distributed cluster. When the dominant defect percentage of a densely distributed cluster is an input to the sampling function unit 102, the number of samples is determined by the predetermined computation according to the dominant defect percentage.

When the dominant defect percentage is high, it is not necessary to obtain all the classified-by-kind defect percentages and it is sufficient for only the dominant defect mode to be known in order to understand the nature of the defects. Note that if only an estimation of this dominant defect mode is desired, the number of samples can be reduced by specifying a large allowable error value 112B.

Referring again to FIG. 1, the user can input a sampling mode specifier 112D of DD %-estimation. In this mode, the allowable error is set by a predetermined computation (step 122); for example, e=P−0.5. Processing continues as previously disclosed to produce the number of samples result 132. The sampled defects 113 is produced by randomly selecting a number of defects from the classified data 115 equal to the number of samples result 132. The defects can be sampled from the entire population of defects identified on the wafer 101, or from one or more of the clusters of defects identified on the wafer.

Figure 4:
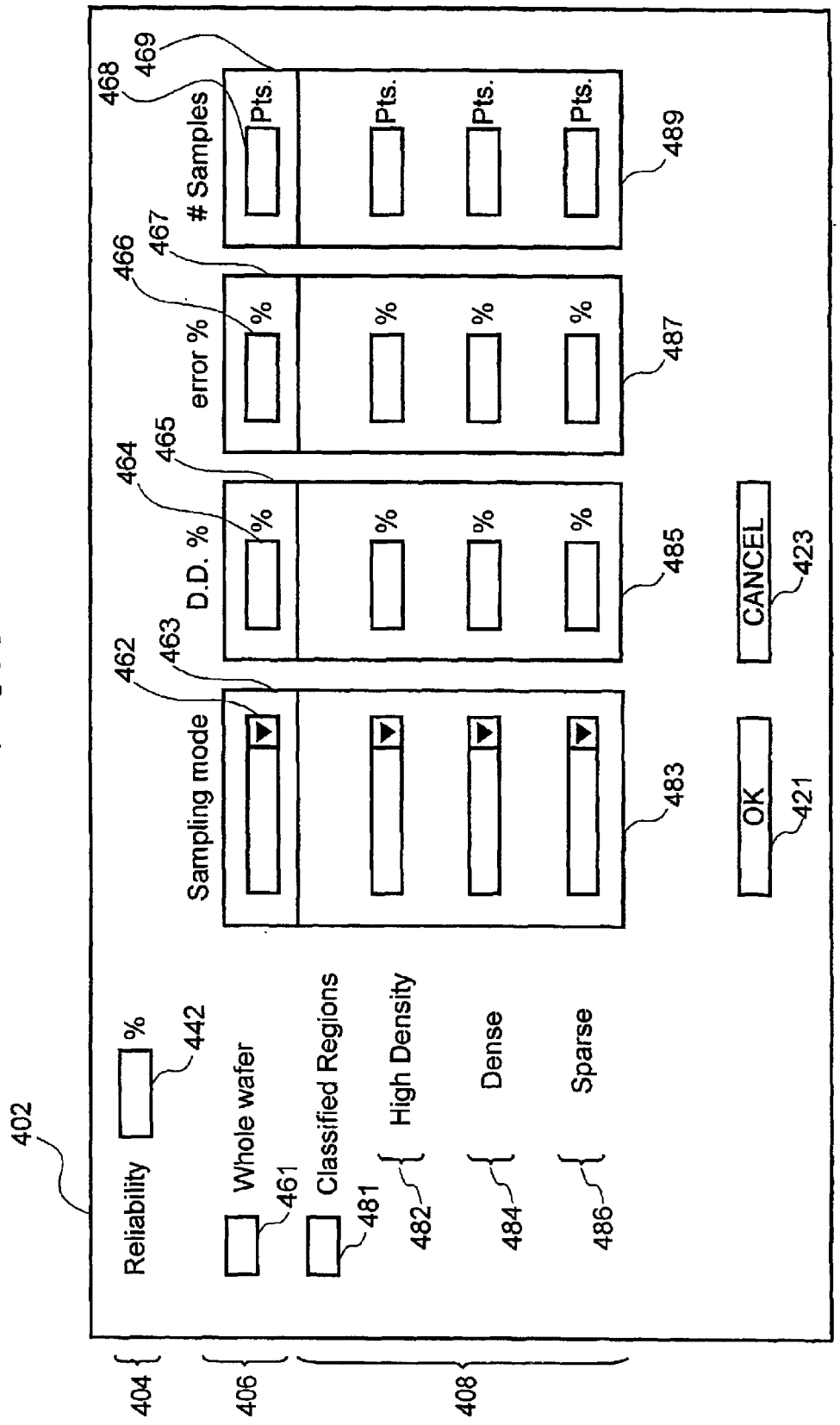
FIG. 4 shows a typical user interface in accordance with an embodiment of the invention.

FIG. 4 shows an illustrative example of a graphical user interface (GUI) 402 comprising a plurality of various graphical elements for exchanging information to be provided to the sampling function unit 102. This includes prompting for user input and presenting choices for selection by a user. Though a GUI is disclosed for receiving user-provided information for the sampling function unit, it is understood that other forms of input are equally applicable, depending on the particular operating environment. It may be appropriate to provide the information in a manner that does not require a GUI; for example, in an automated batch processing operation, where the input is predetermined and automatically fed to the sampling function unit in concert with the flow of wafers through the system.

In accordance with the foregoing illustrative embodiment of the invention, the GUI 402 comprises three areas: a reliability entry area 404, a mode selection and data entry area 406, and a detailed data entry area 408. The reliability area 404 comprises a data entry box 442 for receiving a user-provided reliability value 112A (FIG. 1).

The mode selection and data entry area 406 comprises a plurality of information reception areas including a sampling mode selection field 463, a dominant defect percentage data field 465, an allowable error data field 467, and a number of samples data field 469. The mode selection field 463 comprises a drop-down menu 462 for selection of either the %-estimation mode or the DD %-estimation mode. Recall, that %-estimation mode operation provides sampled defects 113 (FIG. 1) based on a user-provided allowable error value 112B. The DD %-estimation mode of operation provides sampled defects based on a user-provided dominant defect percentage value 112E.

The next two fields, the dominant defect percentage data field 465 and the allowable error field 467, each have data entry boxes 464 and 466, respectively, for the respective user-provided percentage values. The number of samples field 469 comprises a data box 468. These data boxes can either display information or receive information, depending on the user action. In a first situation, if either the dominant defect percentage field 465 or the allowable error field 467 is provided by the user, the sampling function unit 102 computes a number of samples result 132. This result is then displayed in the data box 468. In a second situation, the data box 468 can accept a user-provided number of samples specifier 112C. In this second situation, either a dominant defect percentage value is computed and displayed in the dominant defect percentage field 464 (for DD %-estimation mode of operation), or an allowable error value is computed and displayed in the allowable error field 466 (for %-estimation mode of operation).

The detailed data entry area 408 comprises information reception areas for taking samples based on the clusters of defects identified in the wafer 101. In the illustrated embodiment of the invention, recall that three clusters of defects have been defined. Thus, three cluster data entry regions: high density 482, dense 484, and sparse 486 are provided in the user interface depicted in FIG. 4. Each cluster data entry region 482, 484, 486 comprises data entry fields for: the sampling mode (data entry area 483); a dominant defect percentage (data entry area 485); and an allowable error percentage (data entry area 487). A data entry/display field for the number of samples (area 489) is also provided for each cluster data entry region. Cluster data entry regions in addition to regions 482, 484, 486 can be provided if additional clusters are defined for a given wafer.

The checkboxes 461 and 481 allow a user to specify which of the defect data the sampling is to be performed; i.e., the defect data for the entire wafer, or defect data belonging to one of the identified clusters of defects. If the checkbox 461 is selected by the user, then sampling is made on the wafer level. The user-provided information 112 is entered in the mode selection and data entry area 406. The sampling is performed on the entire wafer by sampling defects from the entire population of defects in the classified data 115.

On the other hand, if the checkbox 481 is selected by the user, then sampling is performed on a cluster basis. The user-provided information is entered into one or more of cluster data entry regions 482, 484, 486, one such cluster data entry region for each cluster of interest. The sampling of defects is then made in each cluster from the classified data 115 for which data had been entered in the corresponding cluster data entry region.

The GUI shown in FIG. 4 also includes standard action buttons found in typical GUI's. For example, the figure shows a data accept button 421 and a data cancel button 423. These and additional buttons can be provided as appropriate.

Figure 10:
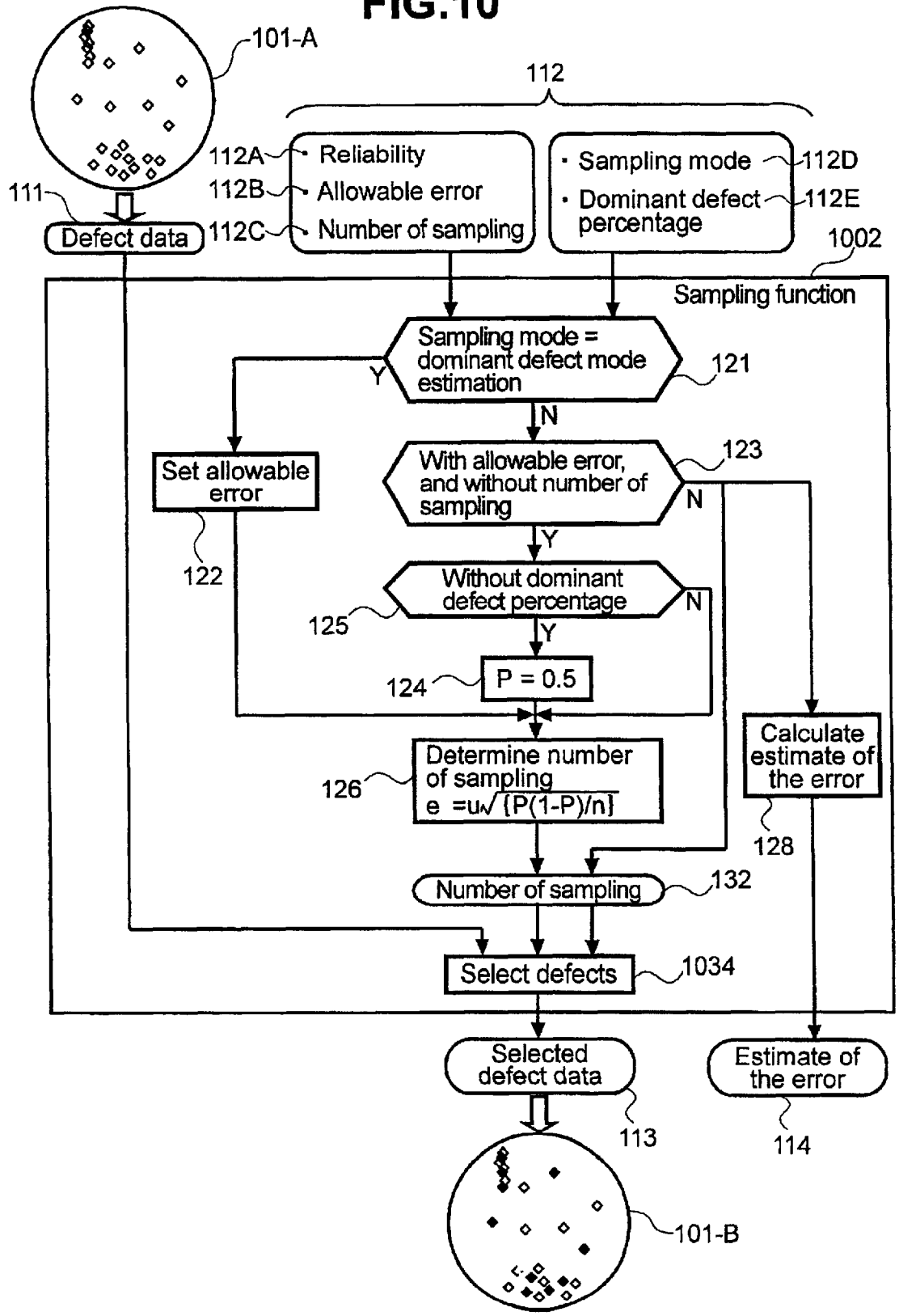
FIG. 10 is a high level schematic illustration of another illustrative embodiment of the present invention.
Figure 11:
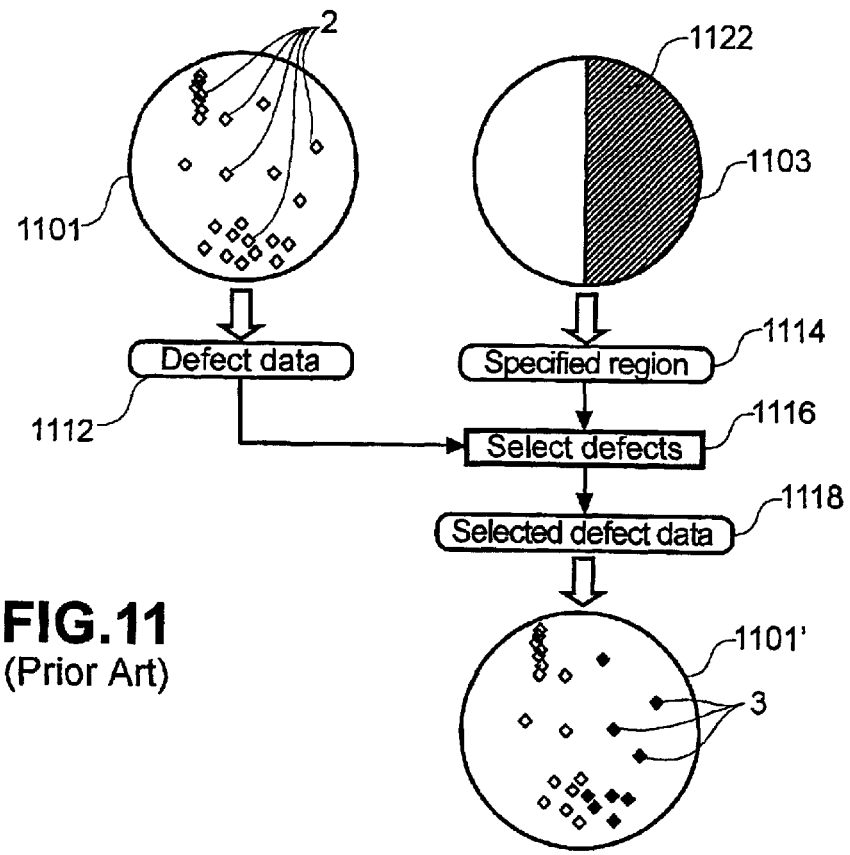
FIGS. 11 and 12 illustrate conventional aspects of wafer inspection tools.
Figure 12:
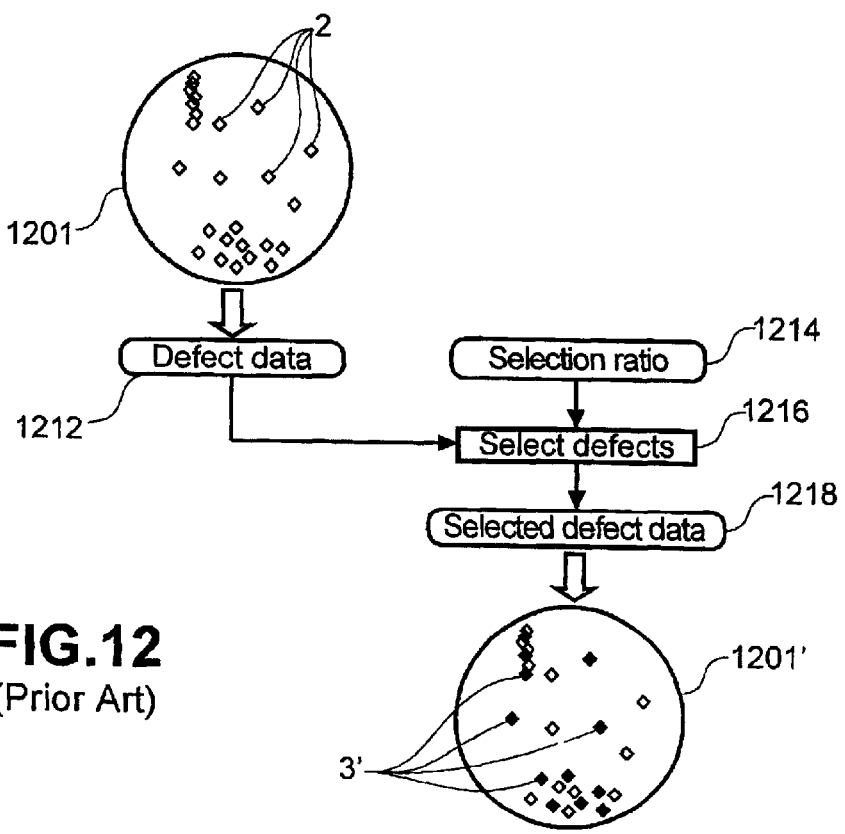

Refer briefly now to FIG. 10, for a discussion of a second illustrative embodiment of the present invention. Those elements shown in FIG. 10 that are also shown in FIG. 1 are identified using the same reference numerals as in FIG. 1. In this second embodiment, the clusters of defects are not identified, and so the classified data 115 (FIG. 1) is not produced. As can be seen, the defect data 111 feeds directly to a defect selection process 1034. The sampled defects 113 are selected by the selection process which, for this second embodiment, does not take into consideration the density distribution of the defects, the sampled defects being sampled from the defect data 111.

Figure 5:
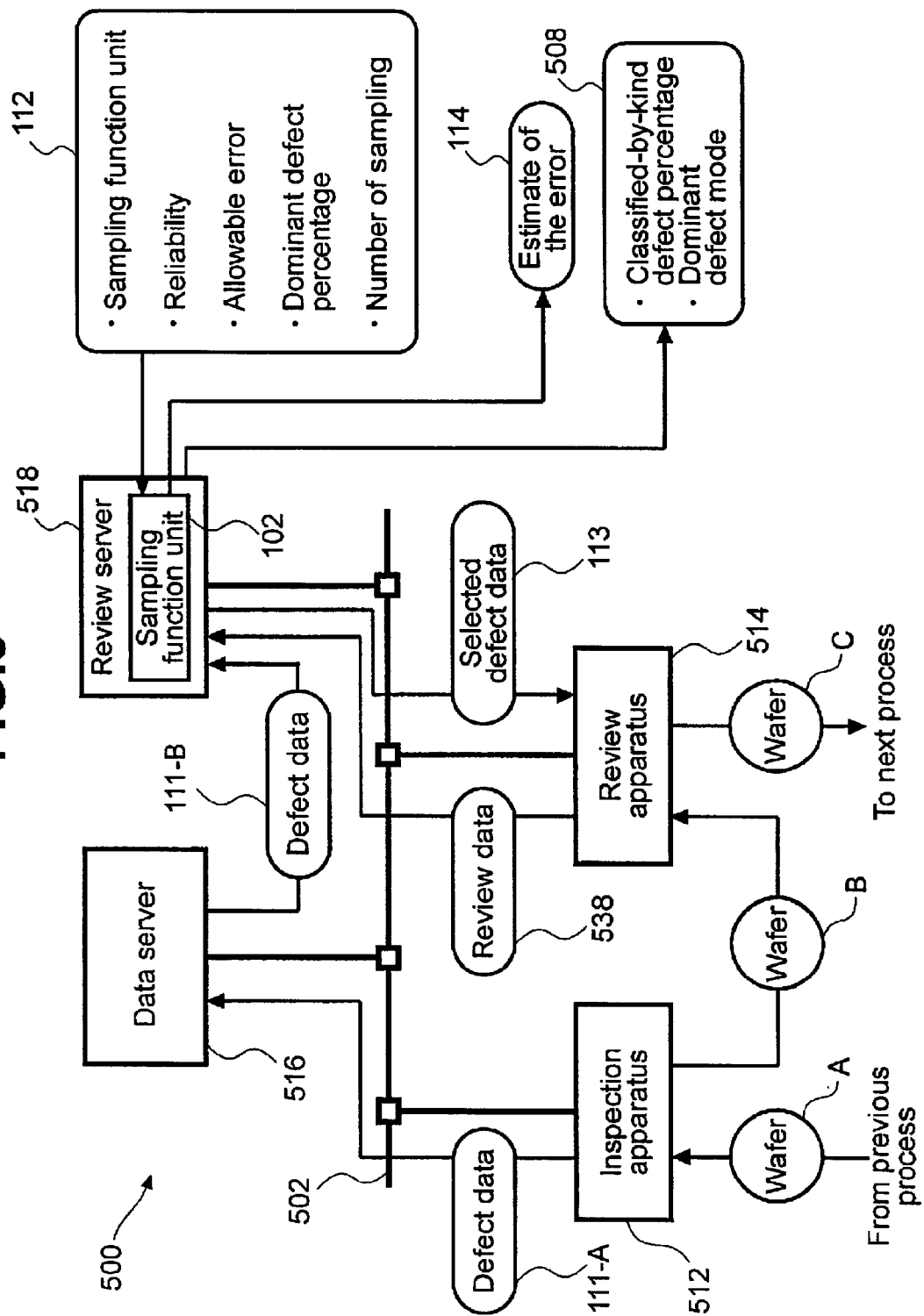
FIGS. 5–8 show high level block diagrams of illustrative examples of various embodiments of a wafer inspection and review system provided by the present invention.

Turn now to FIG. 5 which is a block diagram showing an illustrative example of a wafer inspection and review system 500 according to the present invention. An appropriate communication network 502 provides a data communication path, coupling together the various components which comprise the system. A wafer at position A in the figure is obtained during an earlier processing step and inspected for defects at an inspection apparatus 512. The inspection apparatus is conventionally available wafer inspection equipment.

The inspection apparatus produces defect data 111 which is delivered to a data store. The data store can be any of numerous data storage architectures. An appropriate data storage architecture for the embodiment shown in FIG. 5, for example, might be a data server system 516. The data server provides a repository for the defect data 111 and other data that may be produced and accessed by other components of the system 500.

The wafer proceeds to position B in the figure to a review apparatus 514. The review apparatus contains equipment and processes for making a detailed analysis of the defects on the sample wafer. Typically, the specific defect types are identified and analyzed by the various analytical components which comprise the review apparatus. The particular equipment and processes which comprise the review apparatus will vary depending on the sophistication of the manufacturing facility, factors such as cost, and other considerations not relevant to the invention. Typical equipment, for example, includes a scanning electron microscope.

The review apparatus 514 communicates with a review server 518 to obtain sampled defects 113 from the defect data 111 on the wafer for detailed review. The review server selects the sample of defects in accordance with the present invention. In the embodiment shown in FIG. 5 the sampling function unit 102 resides in the review server. User input 112 (FIG. 1) is fed to the sampling function unit. The sampling function unit samples the defects, as described above, from the defect data stored in the data server 516. The sampled defects 113 are delivered to the review apparatus 514. This may be in the form of a list of locations of the defects, so that the review apparatus has information about where on the wafer to do the additional analyses. The review apparatus performs (manually, automatically, or both) a detailed study of the defects that were sampled to produce review data 538, including producing actual images of the reviewed defects. The review data is delivered to the review server, which then produces summary of defects information 508 summarizing the review data; for example, classified-by-kind defect percentages, the dominant defect mode for each cluster of defects, etc. The summary of defects information 508 can be presented in a GUI, as will be discussed below in connection with FIG. 9.

More specifically, in accordance with the illustrative embodiment of the invention, the summary information 508 comprises a breakdown of the defects in each cluster. This includes, but is certainly not limited to, information such as the dominant defect mode for each cluster wherein the most common kind of defect in the cluster is identified. Also for each cluster, the percentage breakdown (classified-by-kind defect percentage) of each kind of defect in the cluster is determined. A percentage breakdown of all the defects on the wafer is also determined.

The user-provided input 112 can be obtained in any of a number of ways. For example, a computer (not shown) can be connected to the communication network 502, running appropriate software (e.g., GUI 402) to obtain the user input for delivery to the review server 518. Alternatively, the review server itself may provide an interface for the user input 112. Clearly, any of a number of equally effective alternatives are possible. The specific choice of architecture being made based on considerations not relevant to the invention.

Figure 6:
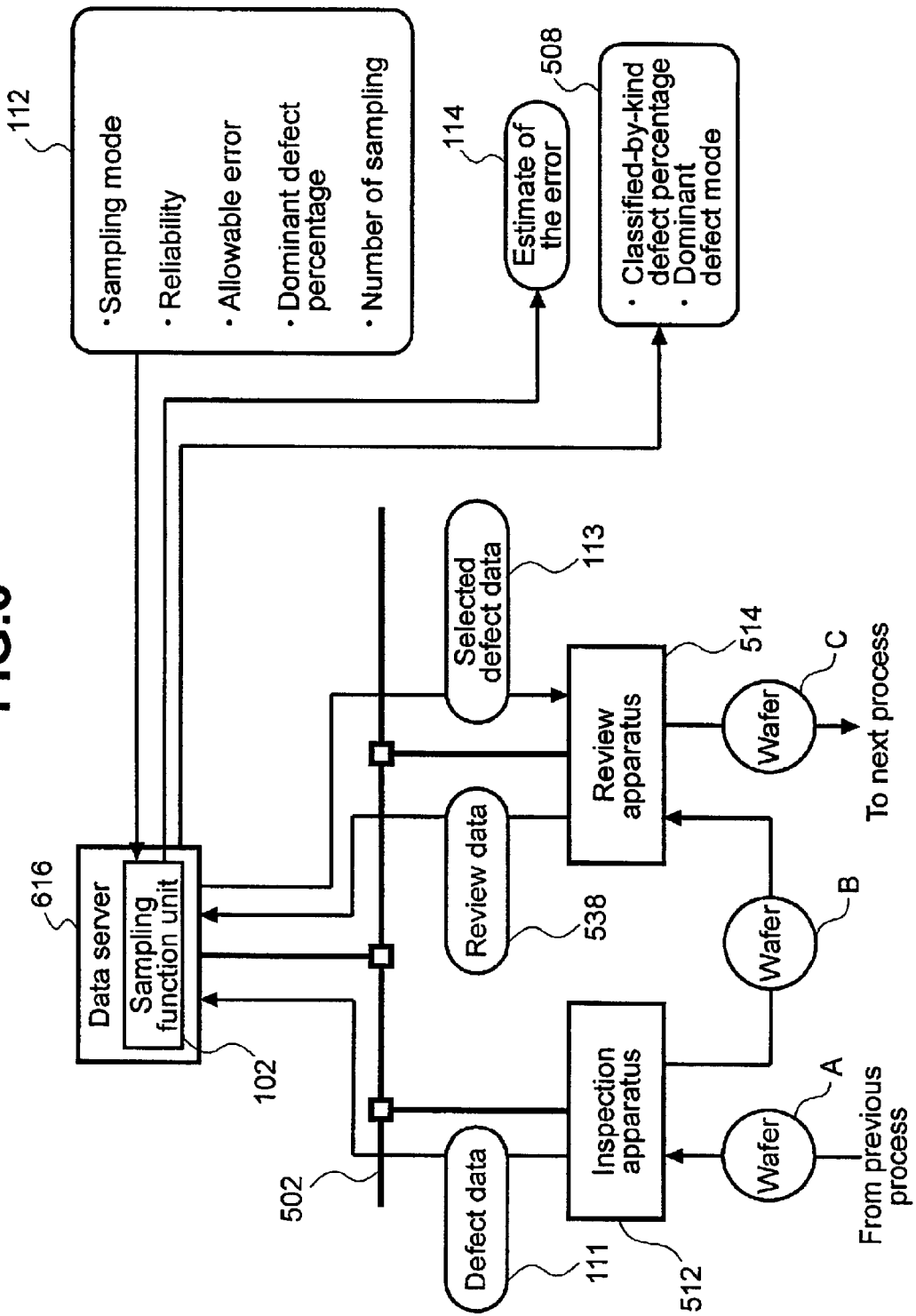
Figure 7:
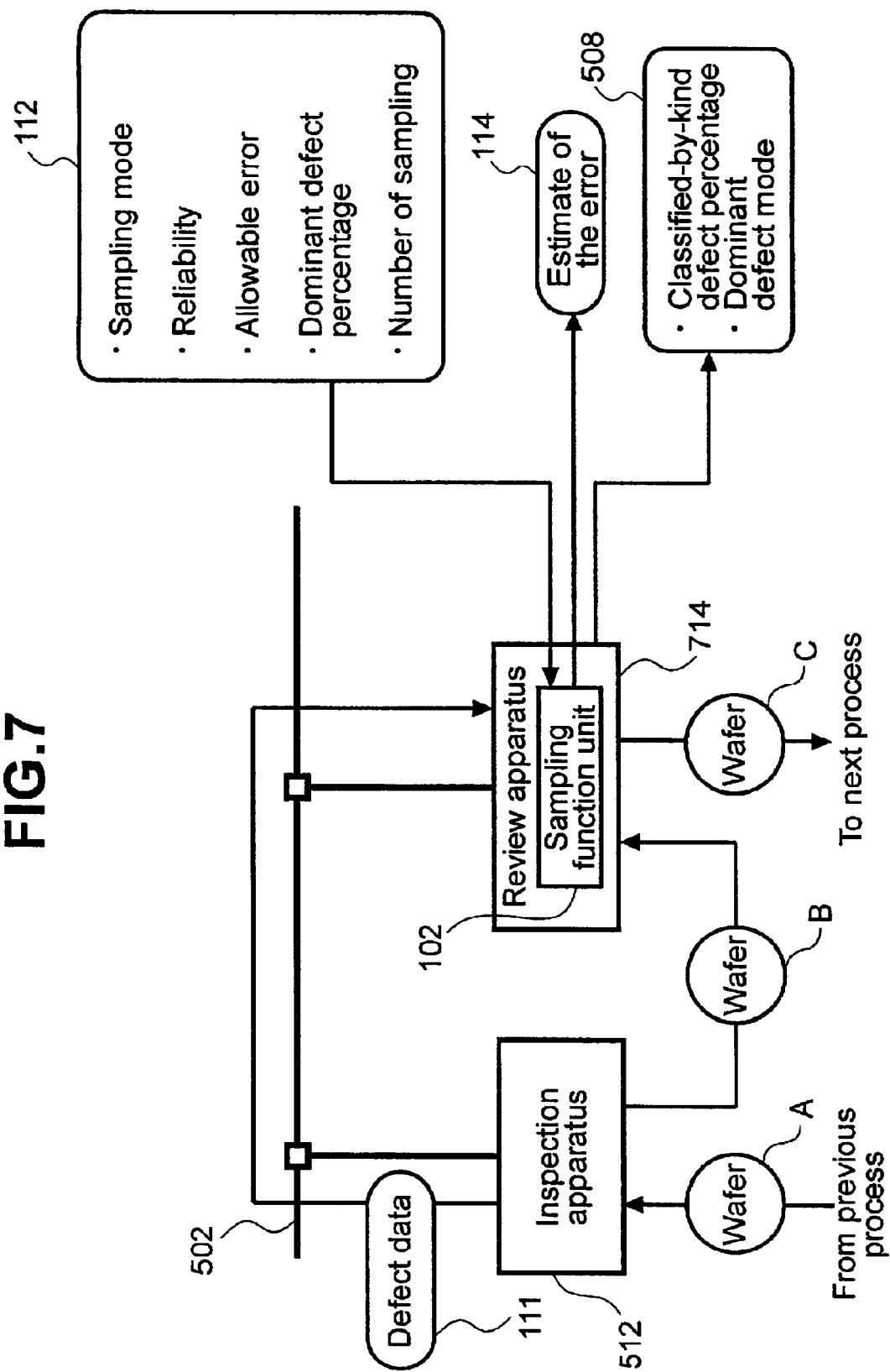
Figure 8:
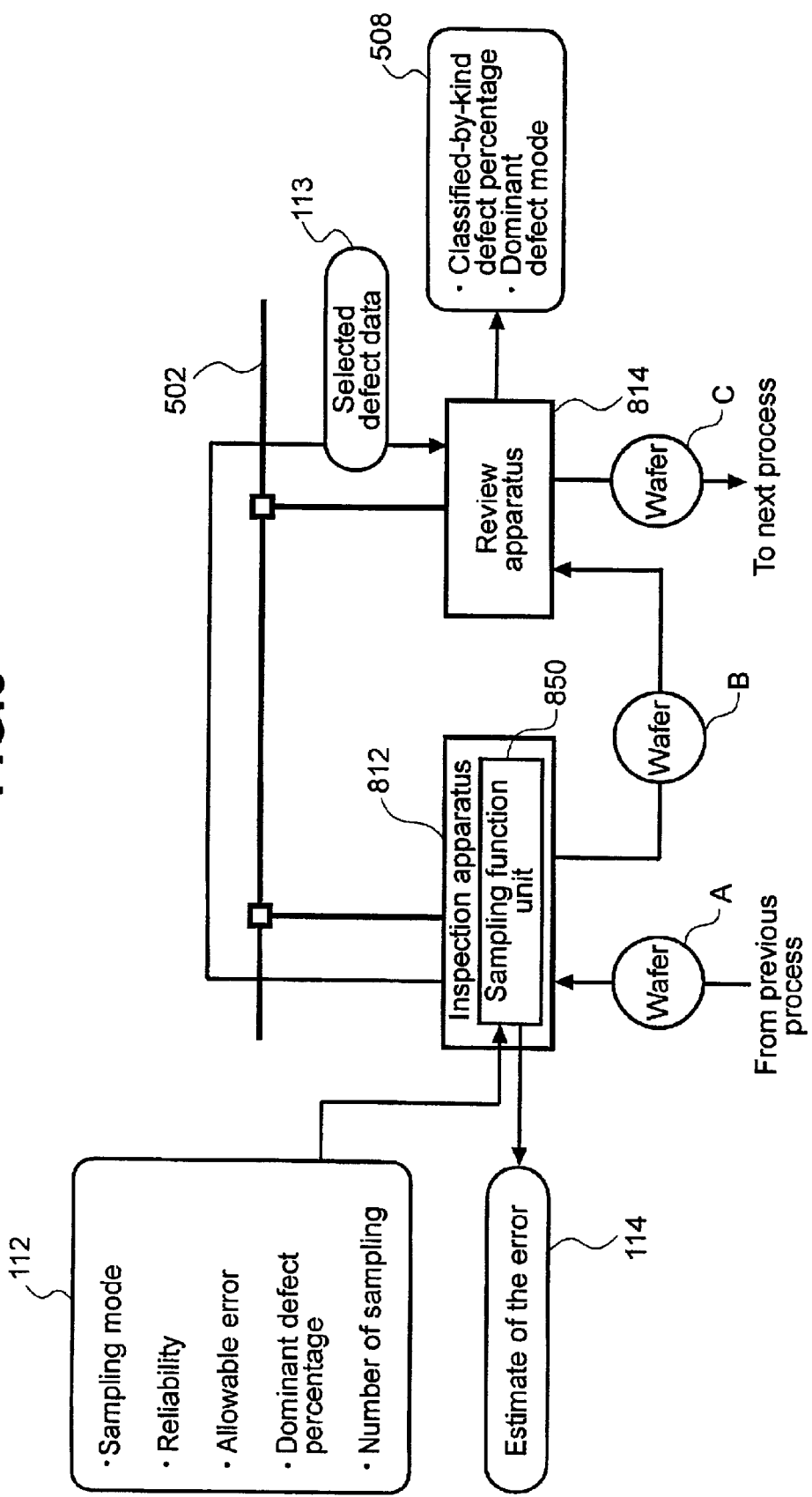

The embodiment shown in FIG. 5 is not a necessary construction of a wafer inspection and review system 500 which embodies the present invention. Other architectures are possible. Merely as examples, FIGS. 6–8 illustrate the variety of architectures possible. As will become clear, the disclosed components can be disposed among the system components in numerous ways. Where the elements are the same as those disclosed in FIG. 5, the same reference numerals are used.

FIG. 6 shows an illustrative embodiment of the invention in which a data server 616 is provided with the sampling function unit 102. Thus, defect data 111 produced by the inspection apparatus 512 is delivered to the data server. User input 112 is provided to the data server from which the sampled defects 113 are produced. As with FIG. 5, a suitable user interface can be readily provided to obtain the user input. The review apparatus 514 performs a detailed analysis of the defects identified in the sampled defects and delivers the review results 538 to the data server. The embodiment of FIG. 6 illustrates that the data server 616 can be configured to receive the review data 538 and to produce information 508 summarizing the review data.

FIG. 7. shows yet another illustrative embodiment of the invention in which a review apparatus 714 is provided with the sampling function unit 102. In this embodiment, the defect data 111 from the inspection apparatus 512 is delivered to the review apparatus. User input 112 is obtained through a suitable user interface (e.g., 402) and provided to the sampling function unit 102 in the review apparatus 714. The sampling function unit produces sampled defects 113 taken from the defect data, which are then subjected to detailed analysis by the review apparatus. In this embodiment, the summary of defects information 508 is produced by the review apparatus.

FIG. 8 shows still yet another illustrative embodiment of the invention in which the sampling function unit 102 is provided in the inspection apparatus 812. The inspection apparatus produces defect data, but does not send it anywhere. Rather, the defect data is retained in the inspection apparatus. User input 112 is provided to serve as the basis for producing the sampled defects 113 taken from the defect data. The sampled data are sent to a review apparatus 814, which then performs the detailed analysis of each of the sampled defects. In this embodiment, the review apparatus produces the summary of defects information 508.

As noted above, the summary of defects information 508 (FIGS. 5–8) can be displayed in a GUI using an appropriately designed display interface. It is noted, however, that other formats for presenting the information will be readily apparent to those of ordinary skill in the relevant arts. As an alternative to a GUI format, hardcopy formats are possible; for example, printing a complete report. This and still other formats will be appreciated as viable alternative embodiments of the invention.

Figure 9:
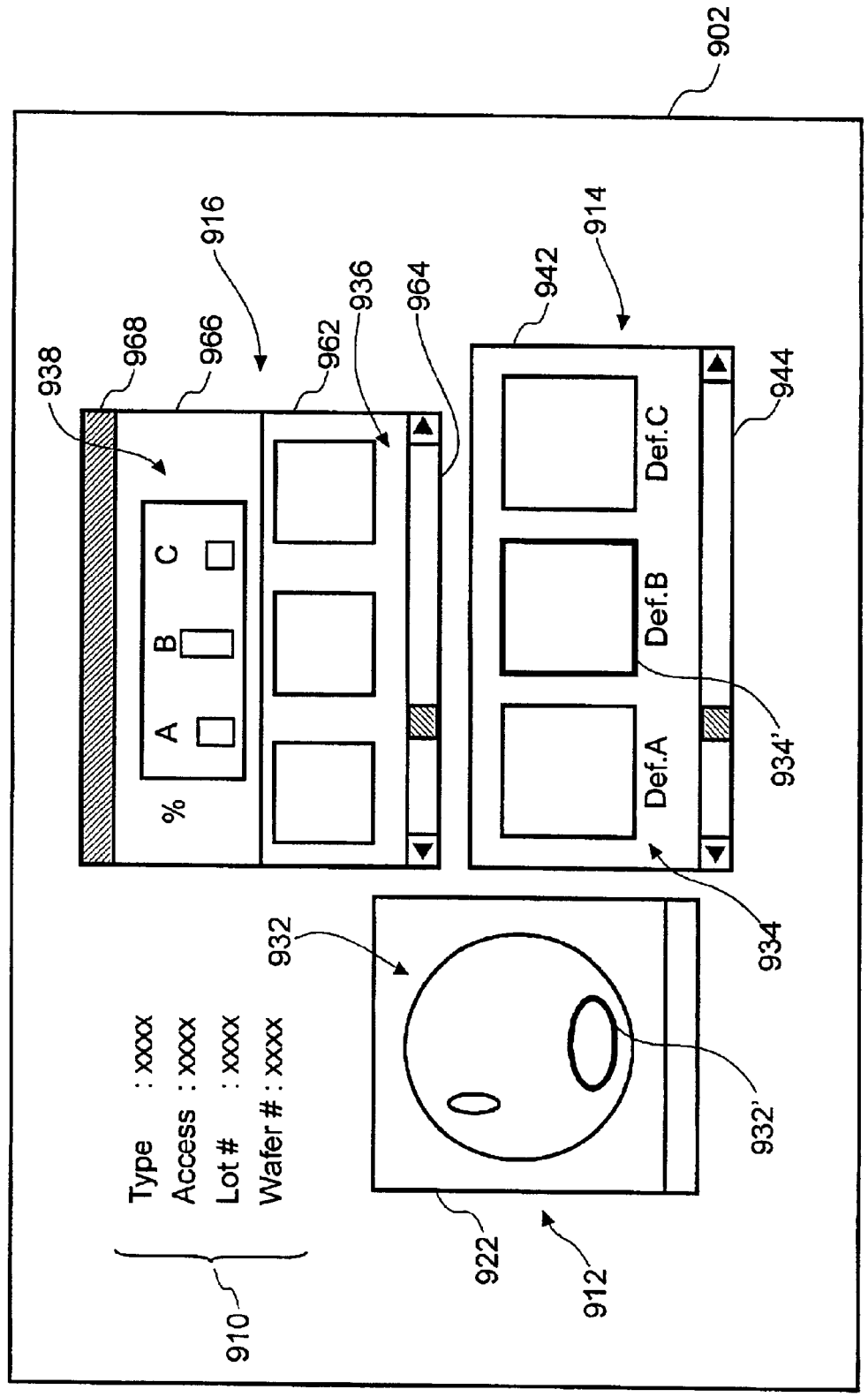
FIG. 9 illustrates a typical user interface in accordance with an embodiment of the invention.

FIG. 9 shows an illustrative example of such an interface. A review result interface 902 showing the summary of defects information 508 can be presented in any appropriate display format, e.g. a display monitor, a projection system, and so on. As will be explained, the review result interface according to an embodiment of the invention can accept user directives to control presentation of different portions of the summary of defects information. A suitable computer system (not shown) having appropriate software is understood to provide the processing needed to drive the review result display and the interaction; the GUI of FIG. 9 represents a manifestation of the software. With respect to the illustrated embodiments of the wafer inspection and review system shown in FIGS. 5–8, the computer system which drives the review result interface is in data communication with the components of the system which contain the data needed by the review result interface.

In accordance with an embodiment of the invention, the review result interface 902 comprises four information exchange areas: a wafer information area 910, a wafer map display area 912, a summary view area 914 and a detailed view area 916. The wafer information area 910 serves to receive user-supplied information relating to the wafer of interest. Typical information that may be used to specify a wafer includes a wafer type, a process description (e.g., metal-1), a lot number, a wafer number, and so on. This information serves to identify a specific wafer from among a plurality of wafers that have been processed and analyzed in accordance with the disclosed illustrative embodiments of the invention, and stored for later review.

The wafer map display area 912 displays the wafer identified in the wafer information area 910. The wafer map area comprises a presentation area 922 for presenting an image or other suitable information representative of the selected wafer 932. Conventionally, a wafer map is displayed. The wafer map, produced from the classified data 115 (or the defect data 111), provides a 'big picture' view of the selected wafer, showing the locations of the coordinate-identified defects on the wafer. The defects can be further identified by clusters from the classified data. As a visual aid, the different clusters can be identified using a color coding scheme in which a color is associated each cluster and presenting defects belonging to a cluster by the associated color. Each defect kind can be represented by a shaped graphic (e.g., triangle, square, circle and so on). In the illustrated embodiment of FIG. 9, the wafer map of a selected wafer is displayed in the presentation area.

The summary view area 914 presents dominant defect mode data of the wafer selected in the wafer selection area 912. The summary view area comprises a presentation area 942 for presenting plural dominant defect images 934. A selection area 944 is provided to display additional dominant defect images in the situation where the size of the presentation area 942 is inadequate for presenting all of the dominant defect images.

Each dominant defect image 934 presents information representative of one of the clusters of defects in the selected wafer 932. Thus in the example described above, recall that three clusters were defined for the wafer 101 (FIG. 1). Consequently, the presentation area 942 for that wafer will show only three dominant defect images, one for each cluster. Generally, if N clusters are defined for a selected wafer, then the presentation area 942 will contain N dominant defect images, one such image for each cluster. In the case where N is large, the selection area 944 is manipulated by the user with an appropriate input device to present groups of dominant defect images in the presentation area 942, say for example three at a time as shown in FIG. 9.

Each dominant defect image 934 represents the main defect mode in the corresponding cluster. Thus, for example, in FIG. 9, the dominant defect image labeled "Def. B" represents an image of the corresponding cluster on the selected wafer 932. Moreover, it indicates that the dominant defect in that cluster is defect type "B." FIG. 9 further illustrates a "highlighting" feature of this embodiment of the invention. The dominant defect image 934' is highlighted with a heavy border; and similarly the corresponding cluster 932' in the selected wafer 932 is highlighted. This facilitates identifying the corresponding cluster in the selected wafer for a given dominant defect image, and vice-versa.

The detailed view area 916 presents further information for a selected one of the dominant defect images 934. The detailed view area comprises presentation areas 962, 966, and 968. The presentation area 968 presents information relating to criteria by which the sampled defects was produced. For example, the user provided reliability value 112A can be displayed in presentation area 968.

The presentation area 962 presents detailed information relating to the cluster corresponding to the selected dominant defect image. For example, in FIG. 9 the selected dominant density image 934' in the presentation area 942 is highlighted and indicates that the dominant defect in the corresponding cluster is defect type "B." The presentation area 962 presents a set of defect images 936 which show the distribution of all of the defects in the cluster corresponding to the selected dominant density image 934'. Each defect image 936 shows the distribution of the sampled defects of a particular kind within the cluster. There are as many defect images 936 for a given cluster as there are kinds of defects in the cluster. A selection area 964 is provided in those cases where there are more defect images than can be accommodated in the presentation area 962, to allow different defect images to be viewed.

The presentation area 966 presents information 938 indicative of the percentage breakdown of each defect type in the cluster corresponding to the selected dominant defect image in presentation area 942. In the illustrated embodiment of FIG. 9, the information 938 is a histogram, representing each defect present in the cluster as a percentage of the total number of sampled defects in that cluster.

The foregoing discloses a typical embodiment of the invention. Variations and modifications of the disclosed illustrative embodiments of the present invention will no doubt suggest themselves to those skilled in the relevant arts. Accordingly, the foregoing discussions should be considered as illustrative and not in a limiting sense.

What is claimed is:

1. A method for inspecting a semiconductor wafer comprising:
   receiving defect information representative of a plurality of defects on a semiconductor wafer;
   taking a statistically-based sampling of said plurality of defects to produce a plurality of N sampled defects, N being a sample number; and
   performing an inspection of each of said N sampled defects to produce summary information representative of results of said inspection of each of said N sampled defects.

2. The method of claim 1 further including receiving user-provided information comprising one or more statistical criteria, wherein said sample number N is a computed number resulting from one or more computations made based on said statistical criteria.

3. The method of claim 1 further including receiving user-provided information comprising one or more statistical criteria, wherein said sample number is produced by a table look-up of one or more data tables.

4. The method of claim 1 further including receiving user-provided information comprising one or more statistical criteria, wherein said sample number is produced by a combination of one or more computations made based on said statistical criteria and a table look-up of one or more data tables.

5. The method of claim 1 wherein said one or more statistical criteria comprise a reliability value and an allowable error value and said step of taking a statistically-based sampling includes randomly sampling N defects from said plurality of defects.

6. The method of claim 1 wherein said one or more statistical criteria comprise a reliability value and a dominant defect percentage value and said step of taking a statistically-based sampling includes randomly sampling N defects from said plurality of defects.

7. The method of claim 1 wherein said defect information is further representative of one or more clusters of said defects, said user-provided information further being representative of one of said one or more clusters, said step of sampling taking a statistically-based being performed on said one of said one or more clusters.

8. The method of claim 7 wherein said one or more clusters of said defects are classified based on density of detects.

9. The method of claim 1 wherein said step of receiving defect information includes performing a first inspection of said semiconductor wafer, said first inspection identifying the presence of a defect.

10. The method of claim 1 wherein said summary information includes first information indicative of clusters of said defects on said semiconductor wafer, second information indicative of a dominant defect in each of said clusters, and third information indicative of a distribution of different kinds of defects in each of said clusters, said method further including presenting said first information, one or more portions of said second information, and one or more portions of said third information.

* * * * *